(12) United States Patent
He et al.

(10) Patent No.: US 9,628,086 B2
(45) Date of Patent: Apr. 18, 2017

(54) NANOELECTROMECHANICAL ANTIFUSE AND RELATED SYSTEMS

(71) Applicant: Case Western Reserve University, Cleveland, OH (US)

(72) Inventors: Ting He, Cleveland, OH (US); Fengchao Zhang, Cleveland, OH (US); Swarup Bhunia, Cleveland, OH (US); Philip X. -L. Feng, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 14/542,343

(22) Filed: Nov. 14, 2014

(65) Prior Publication Data

US 2015/0130509 A1 May 14, 2015

Related U.S. Application Data

(60) Provisional application No. 61/904,255, filed on Nov. 14, 2013.

(51) Int. Cl.
*H01L 23/525* (2006.01)
*H03K 19/177* (2006.01)
(Continued)

(52) U.S. Cl.
CPC ..... *H03K 19/17768* (2013.01); *G01R 27/025* (2013.01); *G11C 17/16* (2013.01); *G11C 17/18* (2013.01); *H01L 23/5252* (2013.01); *H01L 23/5382* (2013.01); *H01L 23/544* (2013.01); *H01L 23/573* (2013.01); *H01L 23/576* (2013.01); *H01L 24/49* (2013.01); *H03K 19/17704* (2013.01); *H03K 19/17724* (2013.01); *H01L 23/62* (2013.01); *H01L 24/32* (2013.01); *H01L 24/48* (2013.01); *H01L 24/73* (2013.01); *H01L 2223/5444* (2013.01); *H01L 2224/05554* (2013.01); *H01L 2224/32225* (2013.01); *H01L 2224/48091* (2013.01); *H01L 2224/48227* (2013.01); *H01L 2224/49* (2013.01);
(Continued)

(58) Field of Classification Search
None
See application file for complete search history.

(56) References Cited

U.S. PATENT DOCUMENTS 5,070,384 A * 12/1991 McCollum .......... H01L 23/5252
257/530
5,266,829 A * 11/1993 Hamdy ............... H01L 23/5252
257/530

(Continued)

*Primary Examiner* — Crystal L Hammond
(74) *Attorney, Agent, or Firm* — Tarolli, Sundheim, Covell, Tummino LLP

(57) ABSTRACT

An antifuse apparatus can include a cantilever extending from a first electrode portion to terminate in a distal end. A second electrode portion can be spaced apart from the cantilever by an air gap. In response to a program voltage across the first and second electrode portions, the cantilever can be adapted to move from an unprogrammed condition, corresponding to an open circuit condition where the cantilever is spaced apart from the second electrode portion, to at least one permanent programmed condition, corresponding to a short circuit condition between the first and second electrode portions where the cantilever engages the second electrode portion.

20 Claims, 8 Drawing Sheets

(51) Int. Cl.
*G11C 17/16* (2006.01)
*G01R 27/02* (2006.01)
*H01L 23/544* (2006.01)
*G11C 17/18* (2006.01)
*H01L 23/538* (2006.01)
*H01L 23/00* (2006.01)
*H01L 23/62* (2006.01)

(52) U.S. Cl.
CPC ........... *H01L 2224/73265* (2013.01); *H01L 2924/00014* (2013.01); *H01L 2924/15184* (2013.01); *H01L 2924/15311* (2013.01); *H01L 2924/181* (2013.01); *H01L 2924/19107* (2013.01)

(56) References Cited

U.S. PATENT DOCUMENTS

| | | | | |
|---|---|---|---|---|
| 5,764,096 | A * | 6/1998 | Lipp | H03K 19/1736 257/320 |
| 6,473,361 | B1 * | 10/2002 | Chen | B81B 3/0054 365/151 |
| 6,525,953 | B1 * | 2/2003 | Johnson | G11C 17/16 365/225.7 |
| 6,881,994 | B2 * | 4/2005 | Lee | G11C 16/3427 257/296 |
| 7,773,492 | B2 * | 8/2010 | Liu | G11B 9/04 369/126 |
| 8,237,228 | B2 * | 8/2012 | Or-Bach | G03F 9/7076 257/369 |
| 2004/0074288 | A1 * | 4/2004 | Shirakawabe | B82Y 15/00 73/105 |
| 2005/0045919 | A1 * | 3/2005 | Kaeriyama | G11C 11/5614 257/211 |
| 2005/0121789 | A1 * | 6/2005 | Madurawe | H01L 27/0207 257/758 |
| 2006/0097342 | A1 * | 5/2006 | Parkinson | G11C 13/0004 257/528 |
| 2006/0097343 | A1 * | 5/2006 | Parkinson | G11C 13/0004 257/528 |
| 2007/0029584 | A1 * | 2/2007 | Valenzuela | G11C 11/50 257/254 |
| 2007/0133248 | A1 * | 6/2007 | Chen | G11C 17/16 365/96 |
| 2008/0160734 | A1 * | 7/2008 | Bertin | B82Y 10/00 438/582 |
| 2008/0211540 | A1 * | 9/2008 | Fujita | H03K 19/17748 326/47 |
| 2009/0129139 | A1 * | 5/2009 | Kam | G11C 23/00 365/129 |
| 2010/0140066 | A1 * | 6/2010 | Feng | H01H 1/0094 200/181 |
| 2011/0001108 | A1 * | 1/2011 | Greene | H01L 27/2436 257/2 |
| 2011/0128112 | A1 * | 6/2011 | Aimi | H01H 1/0036 337/298 |
| 2011/0317325 | A1 * | 12/2011 | Espinosa | H01H 1/0094 361/211 |
| 2012/0138437 | A1 * | 6/2012 | Ng | H01H 1/0094 200/181 |
| 2012/0268985 | A1 * | 10/2012 | Chang | H03H 9/2457 365/164 |
| 2013/0105286 | A1 * | 5/2013 | Despont | H01H 47/00 200/181 |
| 2013/0146429 | A1 * | 6/2013 | Despont | H01H 1/0094 200/181 |
| 2013/0213778 | A1 * | 8/2013 | Davidson | B82Y 15/00 200/181 |
| 2013/0242636 | A1 * | 9/2013 | Pagani | H01H 1/0036 365/129 |
| 2014/0061013 | A1 * | 3/2014 | Despont | H01H 49/00 200/181 |
| 2014/0113449 | A1 * | 4/2014 | Tabib-Azar | H01H 1/20 438/669 |
| 2014/0262707 | A1 * | 9/2014 | Pawashe | H01H 59/0009 200/181 |
| 2015/0357142 | A1 * | 12/2015 | Bulovic | H01L 45/00 200/181 |

* cited by examiner

NANOELECTROMECHANICAL ANTIFUSE AND RELATED SYSTEMS

CROSS-REFERENCE AND INCORPORATION OF RELATED APPLICATION

This application claims the benefit of U.S. Provisional Patent Application No. 61/904,255 filed 14 Nov. 2013 and entitled DEFENSE AGAINST COUNTERFEITING ATTACKS USING ANTIFUSES, which is incorporated in its entirety herein by reference.

GOVERNMENT INTEREST

This invention was made with government support under Grant CCF-1116102 awarded by the National Science Foundation and Grant D11AP00292 awarded by the Defense Advanced Research Program Agency. The United States government has certain rights in the invention.

TECHNICAL FIELD

This disclosure relates to nanoelectromechanical antifuses and related systems.

BACKGROUND

Antifuses are one-time-programmable (OTP) two-terminal interconnect devices. An antifuse has high initial resistance (e.g., open circuit) condition until a programming signal changes it irreversibly to a low resistance condition. It has been extensively employed as an economical and convenient solution in complex logic integrated circuits (ICs) for improved functionality and flexibility, and thus widely used in non-volatile memories and OTP secure field programmable gate arrays (FPGAs). For example, antifuse-based FPGAs offer higher security stemming primarily from their non-volatility. It secures a design due to piracy and difficulty in determining the state of an antifuse that protects against direct physical attack. While many existing antifuse-based FPGAs provide desired security, there exist limitations and challenges relating to high leakage power, increasing security requirements (e.g., against potential attack in the form of reprogramming), and scalability to advanced technology nodes. For instance, many mission critical applications (e.g., military and aerospace) require devices with high programming speed, low power, tolerance to radiation and harsh environment, and high resistance to attacks.

SUMMARY

This disclosure relates to nanoelectromechanical antifuses and related systems.

As an example, an antifuse apparatus can include a cantilever extending from a first electrode portion to terminate in a distal end. A second electrode portion can be spaced apart from the cantilever by an air gap. In response to a program voltage across the first and second electrode portions, the cantilever can be adapted to move from an unprogrammed condition, corresponding to an open circuit condition where the cantilever is spaced apart from the second electrode portion, to at least one permanent programmed condition, corresponding to a short circuit condition between the first and second electrode portions where the cantilever engages the second electrode portion.

As another example, a system can include an arrangement of logic blocks. A matrix of interconnects can extend between the logic blocks, at least some of the interconnects intersecting with each other interconnects in the matrix to define intersections. A plurality of nanoelectromechanical antifuses can be implemented at some of the intersections to provide a one-time programmable connection or open circuit between respective interconnects depending on the state of the nanoelectromechanical antifuse at each respective intersection. In some examples, the system can be a field programmable gate array and other examples it can be a memory device.

DETAILED DESCRIPTION

This disclosure relates to a nanoelectromechanical (NEMS) antifuse and to systems that can utilize such antifuses. The NEMS antifuses can serve as interconnect building blocks for making secure integrated circuits, such as one-time programmable (OTP) memory cells and OTP field programmable gate arrays (FPGAs). As disclosed herein, the NEMS antifuse is based on electrostatically actuated nanocantilevers, such as can be fabricated from silicon carbide (SiC). The NEMS antifuse can include two or more terminals according to the desired function to be employed. For example, a two-terminal antifuse can provide an OTP connection between a pair of interconnects in an integrated circuit. As another example, a three terminal antifuse can provide an OTP connection to set a state of a memory cell while also providing another terminal to read the state value of the cell. As compared to metal-metal antifuses, NEMS antifuses can exhibit very low programming voltage, high current density, abrupt switching, small footprints and long term stability. Thus, NEMS antifuses provide new opportunities for designing low-power, high security and harsh environment operable logic circuits and systems.

Figure 1A:
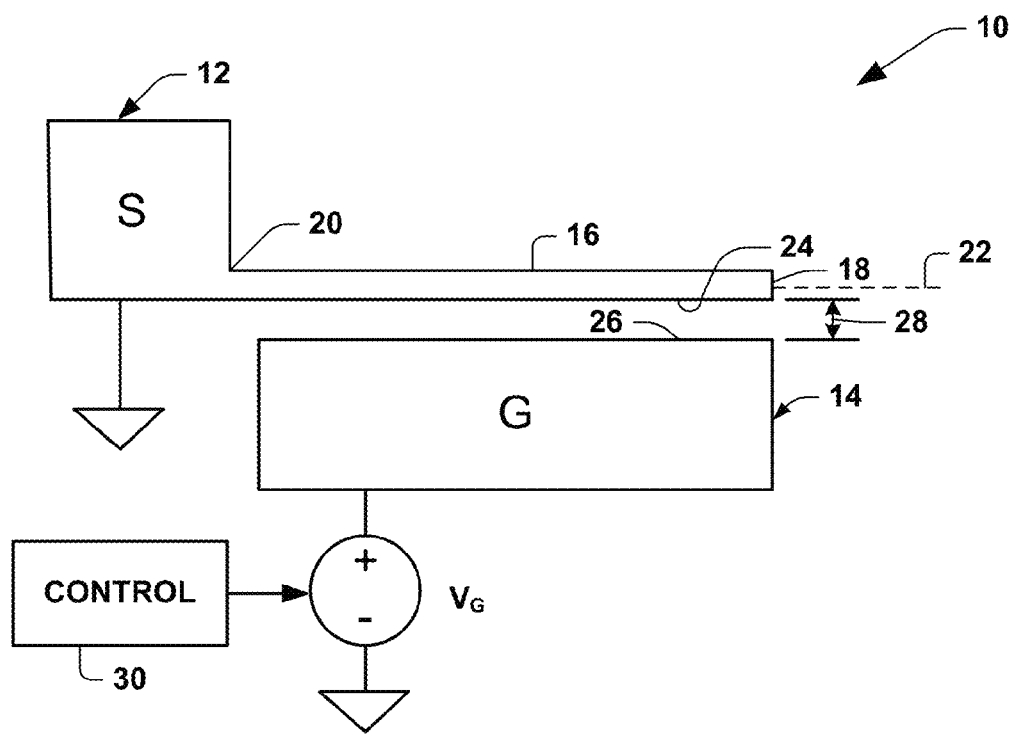
FIG. 1A depicts an example of a nanoelectromechanical antifuse apparatus in a first condition.
Figure 1B:
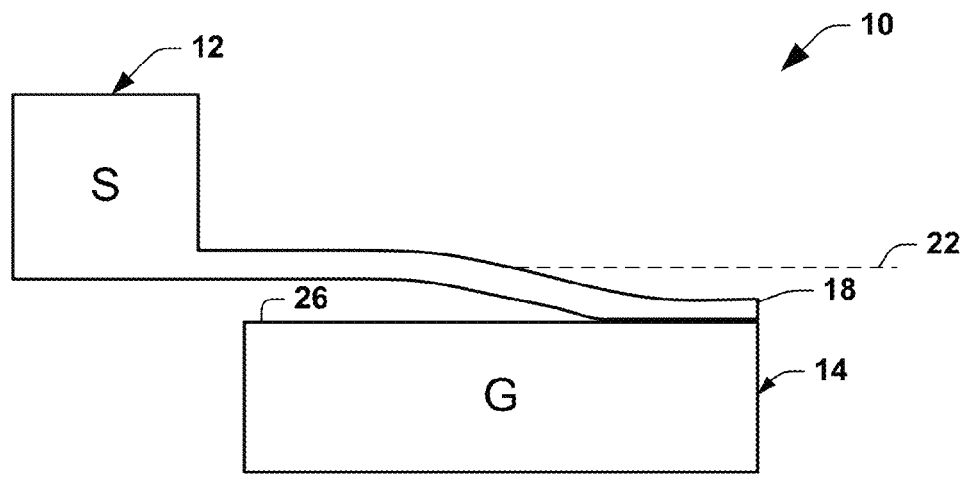
FIG. 1B depicts an example of the nanoelectromechanical antifuse apparatus in a second condition.

FIGS. 1A and 1B depict an example of a NEMS antifuse apparatus 10. The apparatus 10 includes a first (source) electrode portion 12 and a second (gate) electrode portion 14, which are fixed structures in the apparatus. The first electrode 12 includes a cantilever 16 extending from the first electrode portion to terminate a distal end 18 of the cantilever. A proximal end 20 of the cantilever 16 can be integrally formed with the first electrode portion 12. For example, the first electrode portion 12 and cantilever can be an integral structure formed of a layer of semiconductor material, such as silicon carbide (SiC). Antifuse structure can be formed from a thin film layer of SiC that is heavily doped with nitrogen or another dopant (e.g., boron or aluminum) to make the resulting terminals and cantilever more electrically conductive. Thus, the SiC materials can be adapted for NEMS antifuses due to its exceptional ability in carrying high current.

The cantilever 16 can extend along a central axis 22 in its unprogrammed condition shown in FIG. 1A, and have a contact surface 24 that is substantially planar. The contact surface 24 is located opposite a corresponding surface 26 of the second electrode portion 14. The contact surface 24 cantilever 16 thus can be spaced apart from the surface 26 by an air gap, demonstrated at 28 in its unprogrammed condition. In the example of FIGS. 1A and 1B, the first electrode portion 12 can correspond to a source terminal and the second electrode portion can correspond to a gate terminal of the two-terminal antifuse apparatus 10.

The cantilever 16 can be adapted to move from its unprogrammed condition, corresponding to an open circuit where the air gap 28 spaces apart the cantilever from the gate electrode portion 14. The resistance between the gate and source terminals in the unprogrammed condition can be greater than about 10 GΩ. In response to applying a program voltage demonstrated at $V_G$ to the gate electrode 14 electrostatic forces can generate between the gate electrode portion 14 and the cantilever 16 to cause the cantilever 16 to move out of its axis 22, and into permanent contact with the surface 26 of the gate electrode portion 14, as shown in FIG. 1B. That is, a corresponding end portion of the cantilever 16 remains in contact with the gate electrode portion 14 after the program voltage $V_G$ has been removed. The cantilever remains in contact with the gate electrode portion 14 because the adhesion force between the surface 24 and the surface 26 exceeds the mechanical restoring force.

As an example, the adhesion force between two contact surfaces 24 and 26 is proportional to the contact area (e.g., a first order equation can be given by Fa=(Ha*Area)/(6*pi*d), where Ha, pi are constants and d is the distance between two surfaces). The restoring force of the cantilever 16 depends on the spring constant k (which depends on the cantilever dimensions: length, width and thickness) for a given material and the beam displacement. The NEMS AF device 10 is thus designed to have a large contact area and a thickness that sufficient to create adhesion force that exceeds the restoring force. This is in sharp contrast to typical NEMS logic switches where there usually is a very small contact area to reduce the adhesion force.

The apparatus 10 can also include control block 30 that is configured to control the application of the program voltage $V_G$ to the electrode portion 14 for programming the antifuse apparatus 10 from its open circuit condition (FIG. 1A) to its closed short circuit condition (FIG. 1B). The control block can activate the gate voltage to provide a pull-in voltage ($V_{PI}$) that is sufficient to create an electrostatic force to urge the distal end portion of the cantilever 16 into permanent contact with the gate electrode portion 14.

By way of example, a SiC NEMS antifuse can be fabricated starting with an Si wafer that has a layer (e.g., about 500 nm thermally-grown) of $SiO_2$. A layer of polycrystalline SiC (poly-SiC) can be deposited using LPCVD or another deposition technique. A mask (e.g., applied via sputtering PMMA) can be employed to define the pattern with wafer-scale electron beam lithography (EBL). The pattern can be transferred to the SiC layer using reactive ion etching. The suspended cantilever can then be released via an etching of the patterned $SiO_2$ (e.g., etching with vapor HF) to provide the OTP NEMS antifuse apparatus 10.

Figure 2:
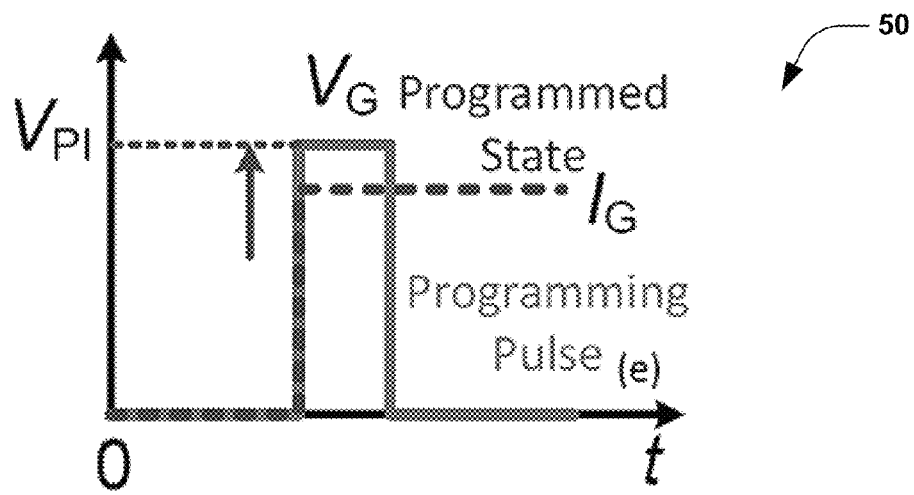
FIG. 2 is a graph demonstrating program voltages that can be applied to program a nanoelectromechanical antifuse apparatus.

FIG. 2 demonstrates an example of the program voltage $V_G$ that can be supplied as a pulse at or above a minimum pull-in voltage $V_{PI}$ to program the antifuse apparatus 10. In response to supplying $V_G=V_{PI}$, current $I_G$ increases rapidly and flows through the apparatus from the gate electrode portion to the source electrode portion that is coupled to a lower potential (e.g., electrical ground). At the initial (unprogrammed) state, G and S form an open circuit having a high resistance. Also shown in FIG. 2, the current through the NEMS antifuse between gate and source electrodes 12 and 14 increases abruptly when $V_G=V_{PI}$, corresponding to substantially instantaneous programming via NEMS contact between cantilever 16 and the gate electrode portion 14.

Referring back to FIG. 1A, in the device operation, the movable cantilever 16 can be grounded at its clamping point via the source electrode 12 to provide a voltage potential reference with respect to the program electrode 14. To understand the operation of the NEMS apparatus 10, the apparatus can be modeled as a parallel plate capacitor, with one plate fixed and the other attached to a spring. The capacitance of this parallel plate $C_{act}$ can be expressed as follows:

$$C_{act} = \frac{\varepsilon A_{act}}{g_{GS} - x}, \qquad (1)$$

where ∈ is the permittivity of air, $A_{act}$ is the overlapping area of the two plates (e.g., corresponding to the overlapping area of the surfaces 24 and 26), x is the distance the plate moves, and gGS is the as-fabricated gap between the two plates.

When the program voltage $V_G$ is applied between the two plates, the total force acting on the movable plate can be expressed as follows:

$$F = \frac{1}{2} \frac{\varepsilon A}{(g_{GS} - x)^2} VG^2 - kx \qquad (2)$$

The behavior of the apparatus 10 can be understood by its electrostatic coupling via the air gap capacitor. As the applied gate voltage $V_G$ increases to the pull-in voltage $V_{PI}$ or beyond, the NEMS antifuse is programmed. The pull-in voltage $V_{PI}$ can be expressed as follows:

$$V_{PI} \approx (8k_{eff} g_{GS}{}^3 / 27 \in t_B L_G)^{1/2} \qquad (3)$$

where $k_{eff}$ is the effective stiffness of the cantilever, gGS the gap between G and S, ∈ the dielectric constant, $t_B$ the thickness of the cantilever, and $L_G$ the length of the actuation gate, respectively.

After programming the total force acting on the cantilever is $F_a - F_{M,max} = 0$, where $F_a$ is the contact adhesion force and $F_{M,max}=k_{effgGs}$ is the mechanical restoring force when the contact is made. The switching time can be estimated by $$\tau_a \approx \sqrt{27/2}(V_{on}/\omega_0 V_G), \quad (4)$$

where $\omega_0$ is the resonance frequency of the cantilever, with $f_0$ being the fundamental-mode resonance frequency of the cantilever beam, $V_{PI}$ the pull-in/programming voltage and $V_G$ the actual applied gate voltage.

Figure 3:
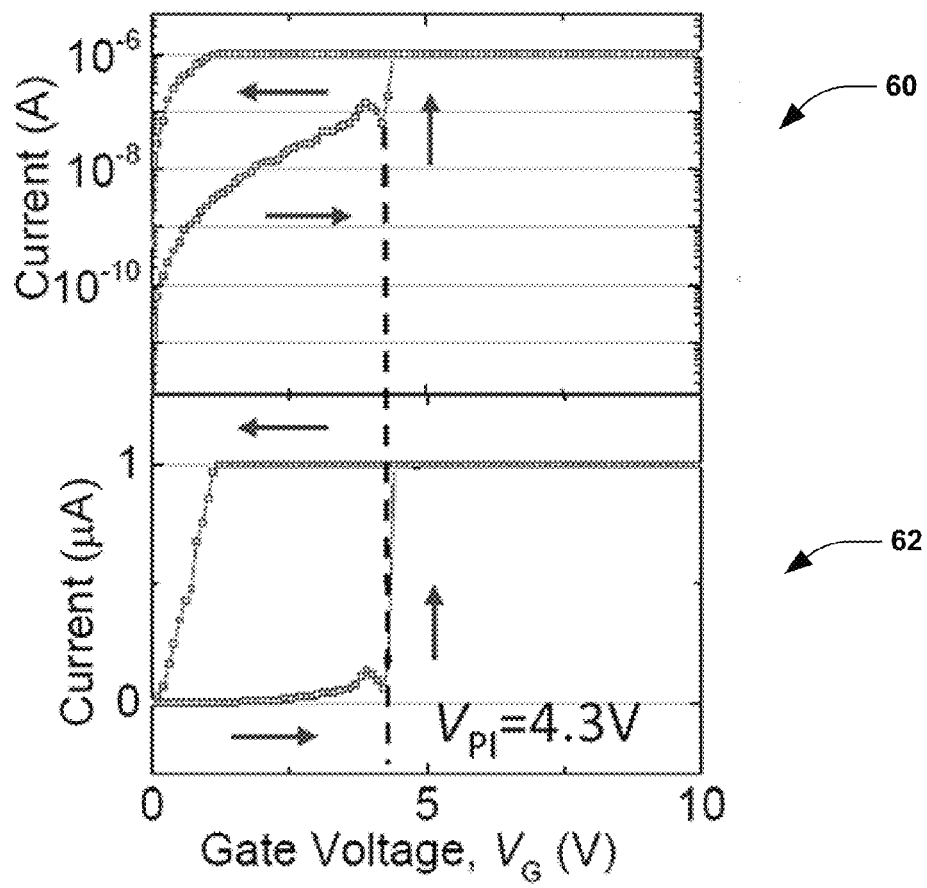
FIG. 3 depicts an example of current through a NEMS antifuse apparatus in response to sweeping a gate voltage.

As mentioned above, prior to programming, the NEMS antifuse operates as an open switch (e.g., having high resistance of about >10 GΩ). During programming, as shown in FIG. 3, the current through the NEMS antifuse between gate and source electrodes 12 and 14 increases abruptly when $V_G=V_{PI}$ (e.g., $V_{PI}=4.3V$), demonstrating instantaneous programming via NEMS contact. In FIG. 3, the current in graph 60 is plotted in a logarithmic scale and in graph 62 as a linear scale. As $V_G$ sweeps back to 0V (demonstrated by arrows pointing to left of $V_{PI}$), the antifuse stays connected with on-state current $I_{on} \geq 1$ μA, which represents a current measurement compliance that can be set manually. If sweeping $V_G$ again after the programming cycle, the I-V curves 60 and 62 shows resistive behavior.

Figure 4:
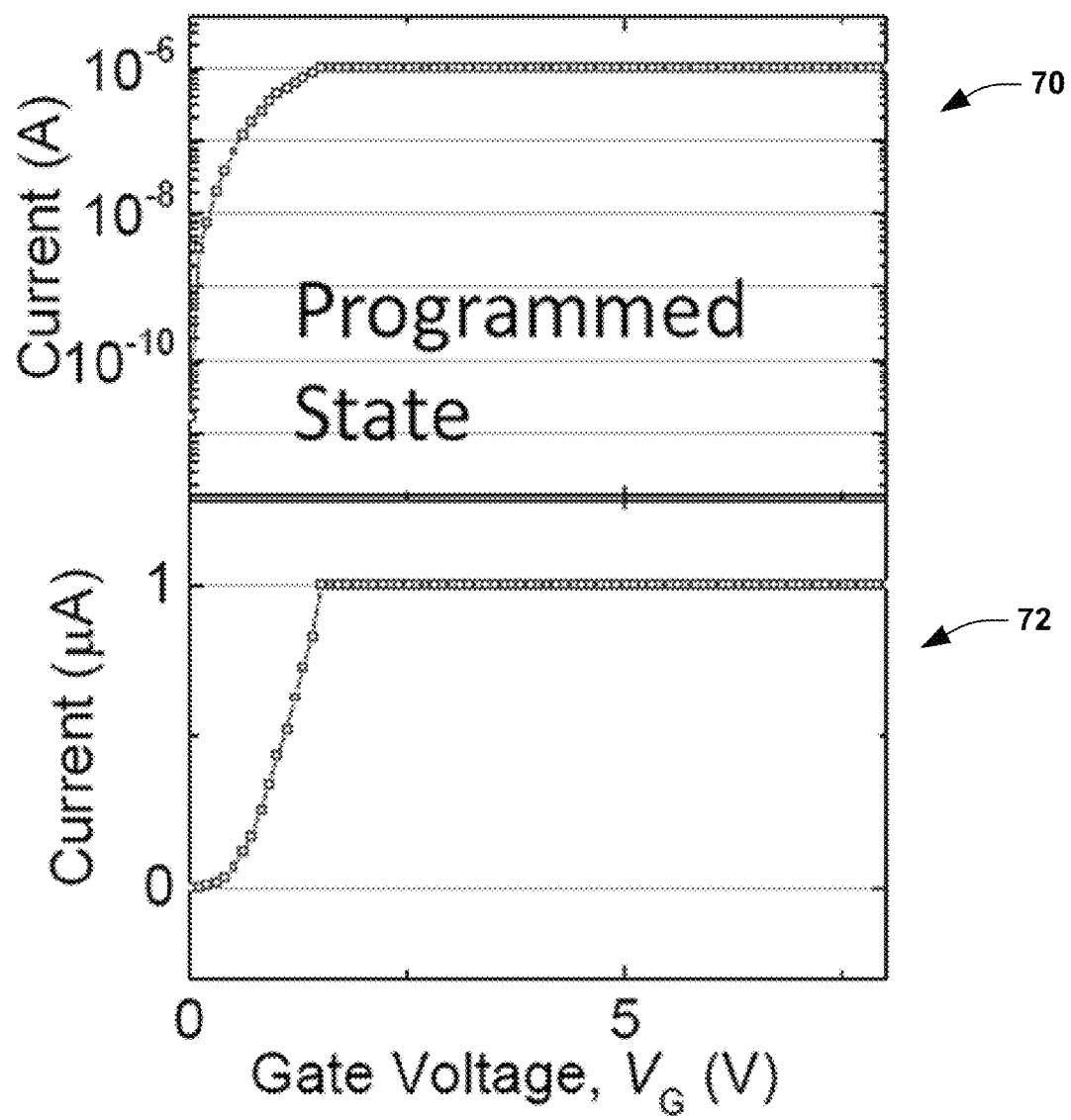
FIG. 4 depicts an example of current through a NEMS antifuse apparatus.

FIG. 4 demonstrates plots 70 and 72 of current as a function of $V_G$ for programming a different antifuse device (current in graph 70 is plotted in a logarithmic scale, while current in graph 62 is in a linear scale). In the example of FIG. 4, the antifuse has a low programming voltage $V_{PI}=2.2V$ and a lower measurement compliance of about 100 nA. From the examples of FIGS. 3 and 4 it is demonstrated that different configurations of antifuses can be designed to provide desired electrical parameters (e.g., program voltages, compliance current), which may vary according to application requirements.

Additionally, the NEMS antifuse device constructed as disclosed herein exhibits low leakage current. The NEMS antifuse device also exhibits long-term stability. For instance, it has been determined that the connection of this already programmed device after 24 months of inactivity had an $R_{on}$ of about 20 kΩ.

Figure 5A:
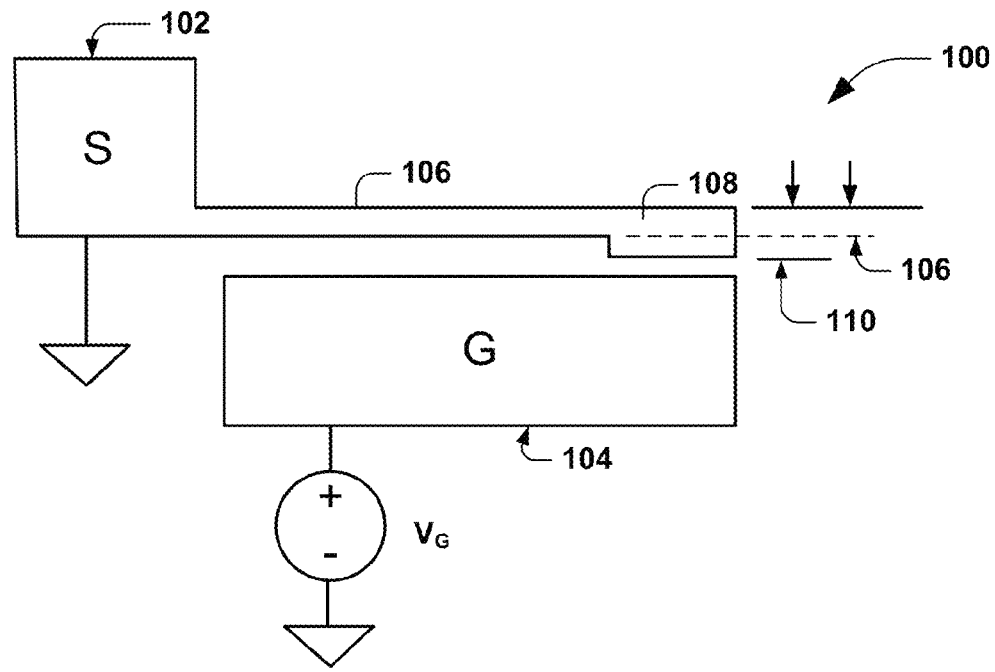
FIG. 5A depicts an example of another NEMS antifuse apparatus in a first condition.
Figure 5B:
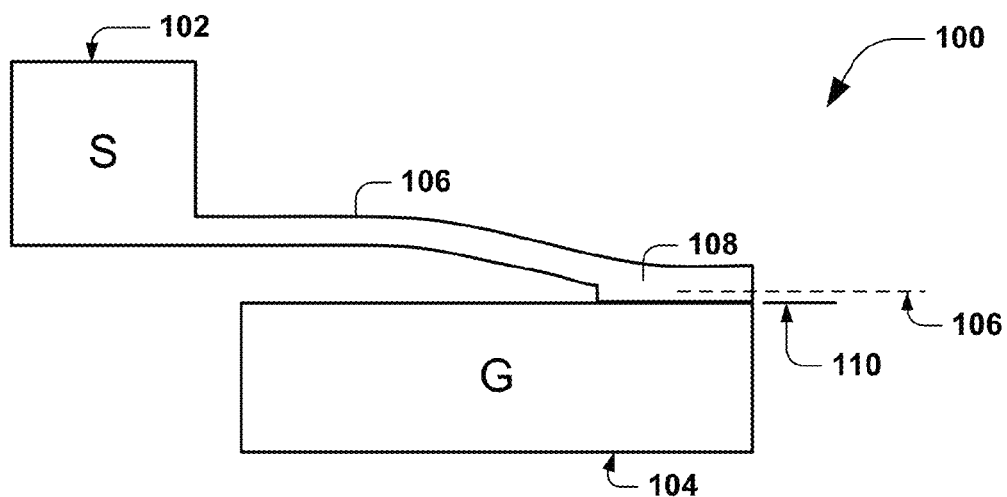
FIG. 5B depicts an example of the NEMS antifuse apparatus of FIG. 5A in a second condition.

FIGS. 5A and 5B depict an example of another NEMS antifuse 100. Similar to the example of FIG. 1, the antifuse includes a source electrode 102 and a gate electrode portion 104. An elongated cantilever 106 extends from the source electrode 102 in opposing relationship with a contact surface of the gate electrode portion 104. A distal end portion 108 of the cantilever 106, which includes a surface area designed to contact a corresponding contact area of the gate electrode in the programmed state, has an increased thickness 110 relative to a proximal portion of the cantilever between the end portion and the source electrode 102. That is, the proximal portion of the cantilever 106 from its fixed point at the source electrode 102 is thinner in a direction perpendicular to the longitudinal axis of the cantilever than the distal end portion 108. The increased thickness 110 of the distal end portion 108 provides an increased stiffness of the contact area, which further helps to minimize the on-state resistance $R_{on}$, which is the resistance of antifuse after programming. Low $R_{on}$ is desired to minimize delay between logic modules. The operation of the NEMS antifuse 100 in the same manner as disclosed with respect to FIG. 1. Briefly, in response to applying a program voltage ($V_G \geq V_{PL}$), electrostatic force can pull the distal end of the cantilever into permanent contact with an opposing contact surface of the gate electrode thus programming the antifuse to a programmed short circuit condition, as demonstrated in FIG. 5B.

Figure 6:
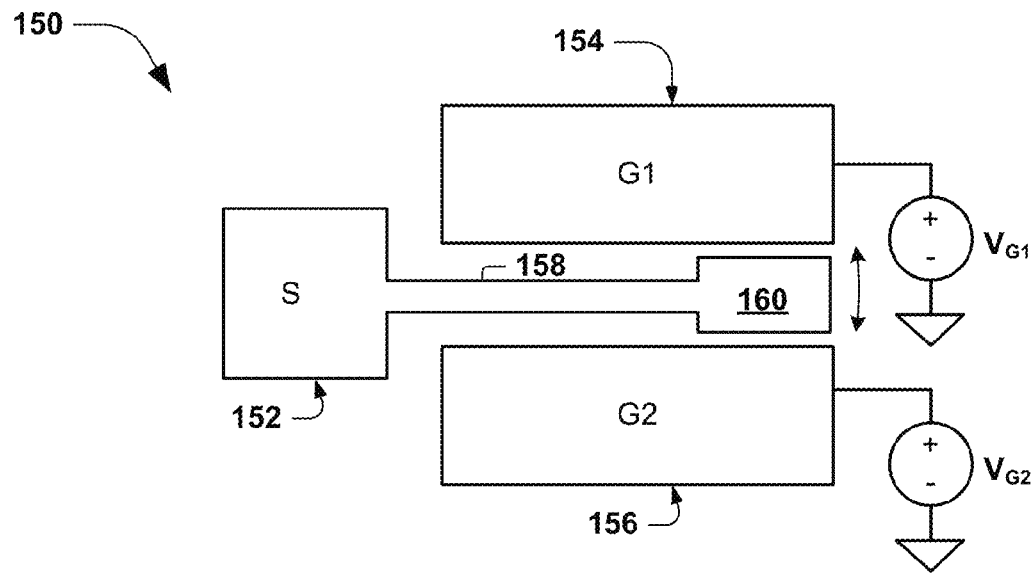
FIG. 6 depicts an example of yet another example of a NEMS antifuse apparatus having multiple gate electrodes.

FIG. 6 depicts an example of another one time programmable antifuse device 150. The antifuse device 150 includes three electrode portions, a source electrode 152 and a pair of gate electrode 154 and 156. A cantilever 158 extends axially from the source terminal 152 between opposing surfaces of the gate electrodes in the unprogrammed condition. In the three terminal example of FIG. 6, the antifuse can be programmed to one of two programmed conditions in response to applying a program voltage $V_{G1}$ between one gate terminal 154 and the source electrode 152 or applying another program voltage $V_{G2}$ between the other gate terminal 156 and the source electrode. Each program voltage $V_{G1}$ or $V_{G2}$ that exceeds a corresponding pull-in voltage creates an electrostatic force to move a contact surface area at the end portion 160 of the cantilever 158 into permanent contact with a corresponding contact area of the respective gate electrode 154 or 156. The contact area between the cantilever 158 and either gate electrode 154 or 156 is designed to ensure that the adhesion force exceeds the returning force of the cantilever.

As mentioned, one key to antifuse-based security is that once an antifuse is programmed, the programmed state cannot change under potential attacks (i.e., the antifuse is an OTP device). One potential attack an antifuse may encounter is reprogramming. For instance, since conventional antifuses that have two states (open circuit or conductive ON), there exists an opportunity for hardware attackers to reprogram one or more unprogrammed antifuses, which can compromise the circuitry implementing the antifuses. The NEMS antifuse design in FIG. 6 addresses this issue by introducing a third state (e.g., having an open circuit unprogrammed state, a programmed short circuit state and a programmed open circuit state). Thus, the example NEMS antifuse 150 can increase hardware security since it can include one unprogrammed state and two different programmed states. In particular, the NEMS antifuse 150 provides one programmed state that provides a permanently short circuit between the interconnects and another programmed state that provides a permanent open circuit between a pair of interconnects. As demonstrated in the example of FIG. 6, the antifuse 150 includes two gates for programming in both directions. Thus, if a given antifuse in an IC should remain open (e.g., unprogrammed), the given antifuse can be programmed to permanently connect to the electrode on the other side to provide a permanently open circuit. This can prevent reprogramming attacks for the given antifuse since the programmed open circuit condition is connection is irreversible.

Figure 7:
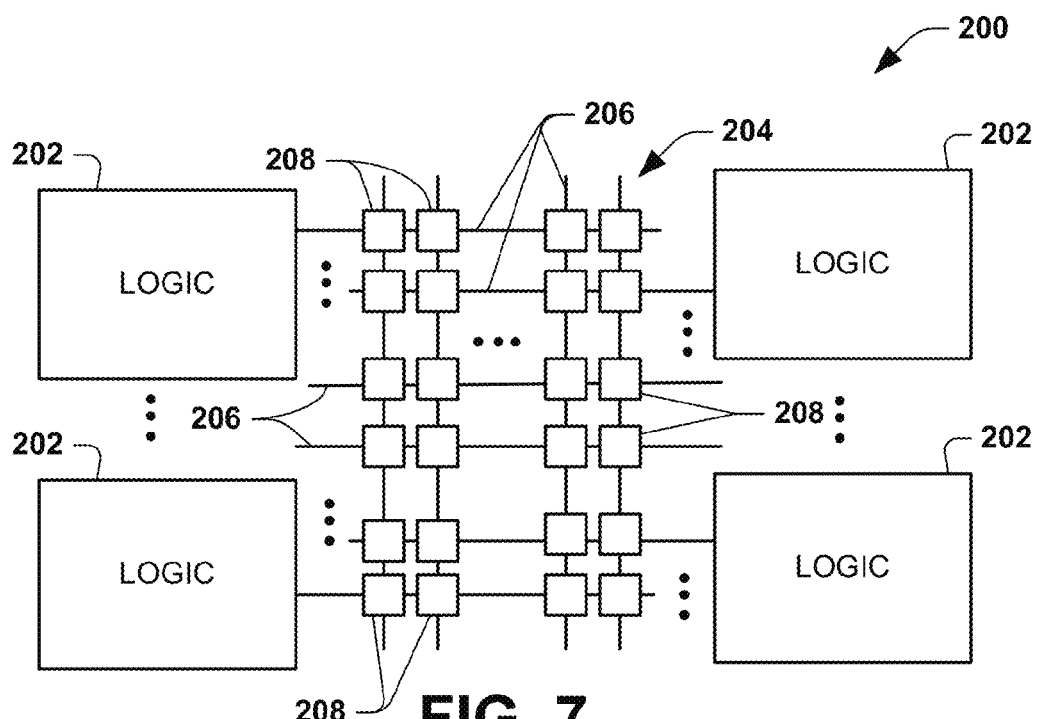
FIG. 7 depicts an example of an FPGA device that can be implemented using NEMS antifuse devices.

FIG. 7 depicts an example of a programmable system 200 for example, the system 200 can be implemented as an antifuse FPGA architecture or other programmable I/C system. In the example of FIG. 7, the system 200 includes a plurality of logic blocks 202 that are interconnected via an interconnect matrix 204. The interconnect matrix 204 includes a plurality of interconnects such as electrically conductive channels that extend in a two-dimensional matrix. For example, a first set of the interconnects can extend in a first (e.g., horizontal) direction and another set of interconnects can extend in a substantially orthogonal (e.g., vertical) direction. The interconnect framework thus results in intersections between overlapping interconnects 206. At some of the intersections, the system 200 includes any NEMS antifuses 208 which can be programmed to connect the intersected interconnects or remain open to maintain an open circuit between the interconnects at such intersections.

It is understood that each of the antifuses 208 in the example of FIG. 7 can be implemented according to any of the examples shown and described herein (e.g., antifuses 10, 100 and 150). For example, an interface circuit can be configured to supply a program voltage across a given antifuse 208. Such interface circuitry can be implemented as part of the logic block or at separate circuitry in the system (not shown). It is understood that the logic block 202 can be implemented in a variety of configurations depending upon the implementation of the system 200. For example, an FPGA, the logic blocks 202 can be implemented as including buffers, register cells (R-cells) as well as combinatory cells (C-cells).

Figure 8:
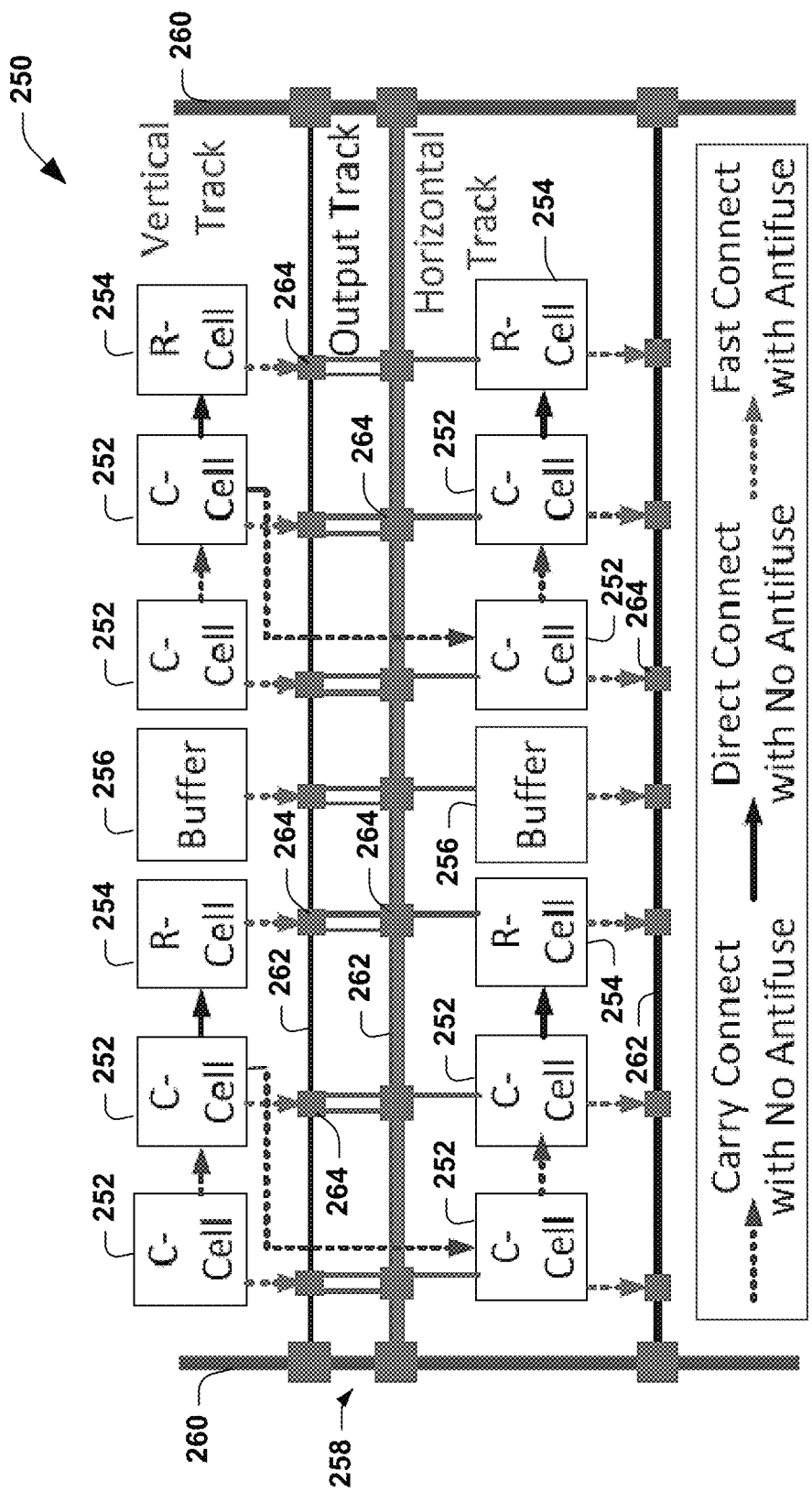
FIG. 8 depicts an example of another FPGA architecture that can be implemented using NEMS antifuses apparatuses.

FIG. 8 depicts an example of an FPGA architecture 250 that can implement any NEMS antifuses. In the example of FIG. 8 the FPGA 250 includes a plurality of c-cells 252, r-cells 254 and buffers 256 interconnected by an interconnect matrix 258. As demonstrated in the example of FIG. 8, the interconnect matrix 258 includes a plurality of vertical interconnects 260 and a plurality of horizontal interconnects 262. The horizontal interconnects 262 can overlap with vertical interconnects at respective intersections at least some of which intersections can include any NEMS antifuse device (e.g., antifuse 10, 100, or 150). The antifuses 264 thus can provide an open circuit condition between the interconnects at each intersections or the antifuses can be programmed to provide a short circuit connection between the interconnects at each respective intersections. Thus the antifuses can provide a permanent passive low impedance connection to facilitate signal propagation in the FPGA 250.

Figure 9:
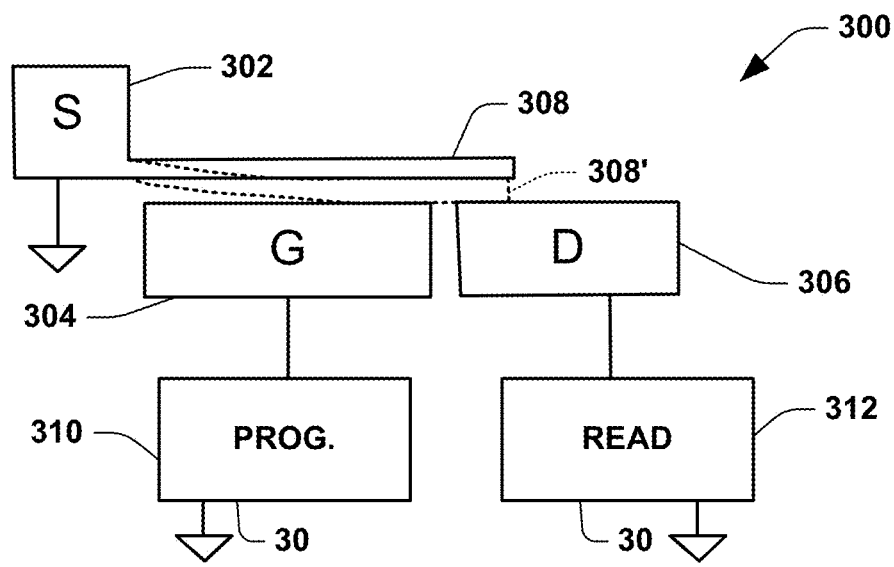
FIG. 9 depicts an example of a one-time programmable memory cell construction that can be implemented using NEMS antifuse apparatus.

FIG. 9 depicts an example of an OTP memory cell 300 that can be implemented using a NEMS antifuse. In the example of FIG. 9, the memory cell includes a source electrode 302, a gate electrode 304 and a drain electrode 306. Similar to FIG. 1, the memory cell 300 includes a cantilever 308 extending from the source electrode 302 along a longitudinal axis determining in a distal end thereof. A contact surface of the cantilever 308 extends over both the gate electrode 304 as well as a portion of the drain electrode 306 in the unprogrammed state. In response to applying a program voltage to the gate electrode 306 via a program control 310, the cantilever moves into contact with both the gate electrode 302 and the drain electrode 306, as shown in dotted lines at 308'. Thus the memory cell 300 can include an unprogrammed state where the cantilever 308 is spaced apart from both electrodes 304 and 306 by an air gap and a programmed state where the cantilever 308' contacts both the gate and drain electrodes. Each state thus corresponds to a different respective binary logic value associated with the memory cell 300. For example, the virgin state before programming can be defined as logic '1', in which the cantilever beam 308 is not contacting the drain electrode 306. The programmed state can be defined as logic '0', where the cantilever 308' remains connected with electrode 306. The read control 312 can provide a read voltage across the drain and source electrodes to determine in which logic state (e.g., logic 0 or 1) the memory cell 300 is. For instance, in response to a read sweep on an unprogrammed memory cell, the read control 312 will detect a high resistance and thus very small current, whereas the same read sweep on a programmed memory cell will have low resistance and a high current.

Figure 10:
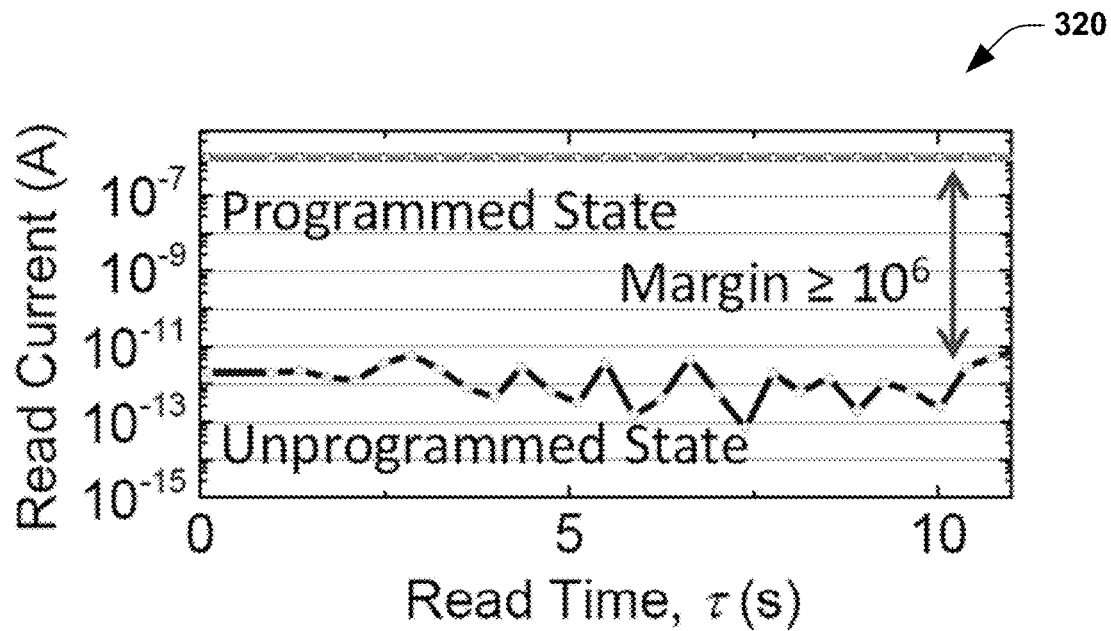
FIG. 10 depicts an example of current for the different states of the OTP memory apparatus of FIG. 9.

FIG. 10 depicts an example of read current values for the programmed and unprogrammed state of the memory cell of FIG. 9. In the graph 320, the read current margin between the programmed and unprogrammed states can exceed $10^6$. This large range gives the circuit designer a good design margin using NEMS antifuse-based OTP memory cells.

Figure 11:
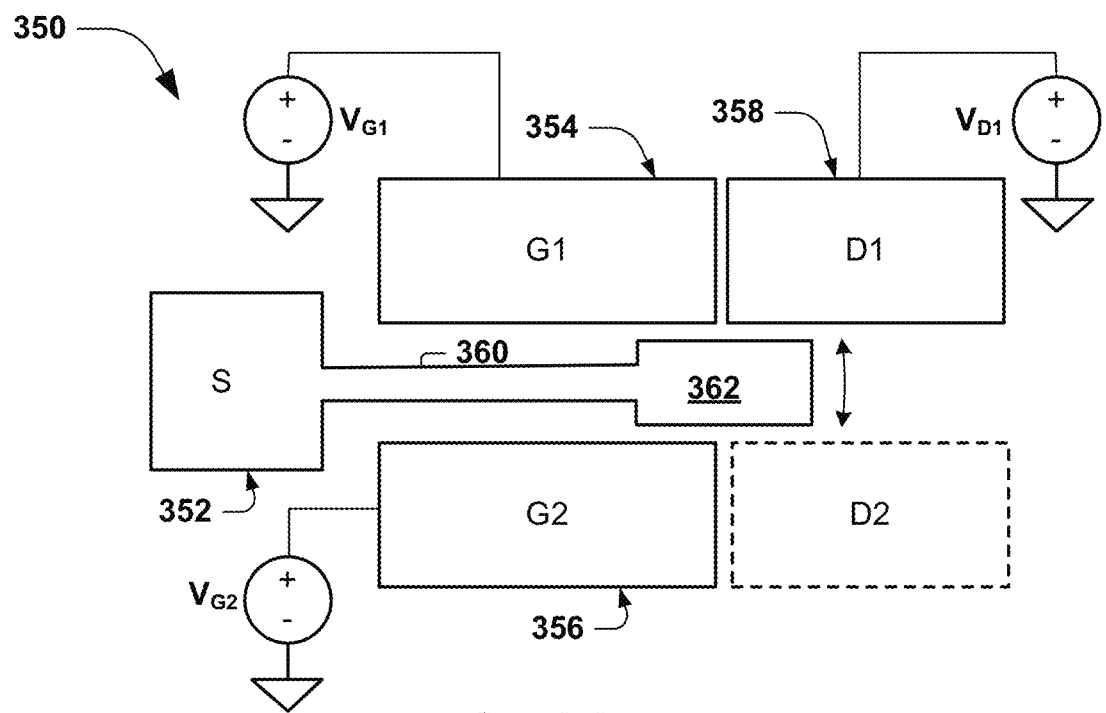
FIG. 11 depicts still another example of a NEMS antifuse apparatus having multiple gate electrodes.

FIG. 11 depicts an example of another type of memory cell 350 that can be implemented using a NEMS antifuse. The memory cell is shown with one drain electrode 358, but may also include another separate drain electrode D2. The OTP memory cell 350 includes a plurality of electrode portions, a source electrode 352, a pair of gate electrodes 354 and 356 and a drain electrode 358. A cantilever 360 extends axially from the source terminal 352 between opposing surfaces of the gate electrodes 354 and 356 as well as along an adjacent surface of the drain electrode 358. A distal end portion 362 includes a pair of opposed contact surfaces. In the unprogrammed condition, opposing contact surfaces of the end portion 362 are spaced apart from both gate electrodes 354 and 356 and drain electrode 358 by respective air gaps. In the example of FIG. 11, the antifuse can be programmed to one of two programmed conditions in response to applying a program voltage $V_{G1}$ between one gate terminal 354 and the source electrode 352 or applying another program voltage $V_{G2}$ between the other gate terminal 356 and the source electrode. Each program voltage $V_{G1}$ or $V_{G2}$ that exceeds a corresponding pull-in voltage creates an electrostatic force to move a contact surface at the end portion 362 of the cantilever 360 into permanent contact with a corresponding contact area of the gate electrode 356 or a combined contact area from a surface of gate electrode 354 and the drain electrode 358. Regardless of which programmed state, the contact area between the cantilever 360 and either the gate electrode 356 or combined area of 354 and 358 is designed to ensure that the adhesion force exceeds the returning force of the cantilever, such that the programmed state is irreversible.

The reading of the programmed state of the cell 350 can be similar to as disclosed with respect to FIG. 10. For instance, a read sweep voltage VD1 can be applied across the drain electrode 350 and source electrode 352 to determine the state of the cell. Depending on the dimensions of the respective contact areas and the thickness of the cantilever, the cell 350 can also be used to implement a one-time or multiple-time programmable nonvolatile memory for regular or harsh environment applications, depending on choice of materials. For instance, SiC beams can be used for harsh environment application. In this case, the gate electrode G2 356 can be used for active pull-off after the cantilever encounters stiction to the top electrode(s) 354 and 358.

It will be appreciated that a NEMS antifuse has the intrinsic advantage of near-zero leakage or off-state current due to the air gaps in the device structure. For example, the measured off-state current can as low as 10 fA or lower, which is the noise floor of the measurement system. This indicates that the ultimate leakage or off-state current is well below this level. The programming voltage can be further adjusted to a desired level such as by scaling the actuation gaps between the gate electrode and the cantilever. The active area for NEMS antifuses is estimated by including the actuation gaps, G and cantilever beam width but no connecting pads, which are only needed for accessing individual devices in the characterization stage. For large network of antifuses the pads can be eliminated to achieve large scale integration. The device volume is calculated by multiplying the active area and the SiC film thickness.

In view of the foregoing, the NEMS antifuse provides robust antifuse structure. The NEMS antifuse can as interconnect building blocks for secure OTP FPGAs as well as OTP memory devices. The NEMS antifuses can have very low programming voltage, high current density, abrupt switching, small footprints and long term stability. NEMS antifuses can also offer significant improvement in power consumption relative to other antifuse-based systems (e.g., metal-metal antifuse FPGA circuitry). NEMS antifuses further will facilitate designing low-power, high security and harsh environment operable logic circuits and systems.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, the term "including" means including but not limited to. The term "based on" means based at least in part on.

What is claimed is:

1. An antifuse apparatus comprising:
a cantilever extending from a first electrode portion to terminate in a distal end;
a second electrode portion spaced apart from the cantilever by an air gap;
a third electrode having a contact surface that is adjacent a surface of the second electrode portion; and
in response to a program voltage across the first and second electrode portions, the cantilever being adapted to move from an unprogrammed condition, corresponding to an open circuit condition where the cantilever is spaced apart from the second electrode portion, to at least one programmed condition, corresponding to a permanent short circuit condition between the first and second electrode portions where the cantilever engages the second electrode portion.

2. The apparatus of claim 1, wherein the cantilever includes a surface facing a corresponding contact surface of the second electrode portion,
wherein, in the programmed condition, a substantial part of the surface of the cantilever proximal the distal end thereof contacts the facing surface of the second electrode portion to provide a contact area therebetween.

3. The apparatus of claim 2, wherein the contact area between the surface of the cantilever and the contact surface of the second electrode portion adapted to create an adhesion force between the cantilever and the second electrode portion that exceeds a mechanical restoring force of the cantilever.

4. The apparatus of claim 1, further comprising a fourth electrode portion opposite the second electrode portion, the cantilever extending between and spaced from respective surfaces of the second and fourth electrode portions, the cantilever being adapted to move from the unprogrammed condition, corresponding to the open circuit condition where the cantilever is spaced apart from each of the second and fourth electrode portions, to one of two permanent programmed conditions in which the cantilever engages a respective surface of one of the second and fourth electrode portions.

5. The apparatus of claim 1, wherein the cantilever extends a length from the first electrode portion that is less than approximately 10 micrometers.

6. The apparatus of claim 1, wherein the first electrode portion, the cantilever and the second electrode portion comprise silicon carbide.

7. The apparatus of claim 1, further comprising a memory cell having a memory state according to the condition of the apparatus,
in the unprogrammed condition, the cantilever extends over and is spaced apart from the contact surface of the third electrode as well as the spaced apart from the second electrode portion, and
in the programmed condition, a portion of the cantilever contacts the second electrode portion and another portion of the cantilever contacts the third electrode.

8. The apparatus of claim 7, wherein the program voltage is applied to the second electrode portion to program a state of the memory cell to a binary value corresponding to one of the programmed or unprogrammed conditions, the memory cell further comprising circuitry connected to the third electrode to apply a read voltage between the third and first electrodes to read the state of the memory cell.

9. A field programmable gate array device comprising:
an arrangement of logic blocks;
a matrix of interconnects extending between the logic blocks, at least some of the interconnects intersecting with each other interconnects in the matrix of interconnects to define intersections; and
the antifuse apparatus of claim 1 disposed at some of the intersections to provide a programmable connection depending on the state of the antifuse apparatus at each respective intersection.

10. The field programmable gate array device of claim 9, wherein the logic blocks comprise at least one of buffers, register cells or combinatorial cells.

11. An antifuse apparatus comprising:
a cantilever extending from a first electrode portion to terminate in a distal end portion, wherein the distal end portion of the cantilever has a thickness that is greater than a thickness of the cantilever proximal the first electrode portion;
a second electrode portion spaced apart from the cantilever by an air gap; and
in response to a program voltage across the first and second electrode portions, the cantilever being adapted to move from an unprogrammed condition, corresponding to an open circuit condition where the cantilever is spaced apart from the second electrode portion, to at least one programmed condition, corresponding to a permanent short circuit condition between the first and second electrode portions where the cantilever engages the second electrode portion.

12. The apparatus of claim 11, wherein the thickness of the distal end portion of the cantilever has a substantially constant thickness from a distal end of the cantilever to a location that is intermediate the distal end and the first electrode portion.

13. A system comprising:
an arrangement of logic blocks;
a matrix of interconnects extending between the logic blocks, at least some of the interconnects intersecting with each other interconnects in the matrix of interconnects to define intersections; and
a plurality of nanoelectromechanical antifuses at some of the intersections to provide a one-time programmable connection or open circuit between respective interconnects depending on the state of the respective nanoelectromechanical antifuse at each respective intersection, each nanoelectromechanical antifuse comprising:
a moveable cantilever; and
a plurality of electrodes each having a contact surface, wherein the one-time programmable connection corresponds to a programmed condition with a given surface of the cantilever contacting the contact surface of two adjacent electrodes of the plurality of electrodes.

14. The system of claim 13, wherein the plurality of electrodes further comprises:
   a source electrode coupled to a first potential, the cantilever extending from the source electrode to terminate in a distal end portion thereof;
   a gate electrode coupled to receive a second potential, the gate electrode having a contact surface that is spaced apart from the cantilever by an air gap;
   a drain electrode having a contact surface that is adjacent a surface of the gate electrode and spaced apart from the cantilever by a corresponding air gap; and
   in response to a program voltage across the source and gate electrodes, the cantilever being adapted to move from an unprogrammed condition, corresponding to an open circuit condition where the cantilever is spaced apart from the gate electrode, to at least one programmed condition, corresponding to a permanent short circuit condition between the source and gate electrodes where the cantilever engages the contact surface of each of the gate electrode and the drain electrode.

15. The system of claim 14, wherein the cantilever includes a surface facing the contact surface of the gate electrode,
   wherein, in the programmed condition, a substantial part of the surface of the cantilever proximal a distal end thereof contacts the facing surface of the gate electrode,
   wherein a contact area between the surface of the cantilever and the contact surface of the gate electrode in programmed condition is adapted to create an adhesion force between the cantilever and the gate electrode that exceeds a mechanical restoring force of the cantilever.

16. The system of claim 14, wherein each nanoelectromechanical antifuse further comprises another gate electrode opposite the gate electrode with the cantilever extending between and spaced from respective surfaces of each the gate electrodes, the cantilever being adapted to move from the unprogrammed condition, corresponding to the open circuit condition where the cantilever is spaced apart from each of the second and third electrodes, to one of two permanent programmed conditions in which the cantilever engages a respective surface of one of the gate electrodes.

17. The system of claim 14, wherein the cantilever of each nanoelectromechanical antifuse extends from the source electrode a length that is less than 10 micrometers.

18. The system of claim 14, wherein each of the source electrode, the cantilever and the gate electrode are formed of silicon carbide.

19. The system of claim 14 configured as a field programmable gate array, wherein the logic blocks comprise at least one of buffers, register cells or combinatorial cells.

20. The system of claim 14 configured as a memory device, wherein each nanoelectromechanical antifuse further comprises
   a memory cell having a memory state according to the condition of the respective nanoelectromechanical antifuse, in the unprogrammed condition, the cantilever extends over and is spaced apart from the contact surface of the drain electrode as well as the spaced apart from the gate electrode, and in the programmed condition, a portion of the cantilever contacts the gate electrode and another portion of the cantilever contacts the drain electrode.

* * * * *